(12) United States Patent
Lu

(10) Patent No.: US 12,150,295 B2
(45) Date of Patent: Nov. 19, 2024

(54) METHOD FOR MANUFACTURING A MEMORY USING A PLURALITY OF SACRIFICIAL PILLARS

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 418 days.

(21) Appl. No.: 17/665,744

(22) Filed: Feb. 7, 2022

(65) Prior Publication Data

US 2022/0216216 A1  Jul. 7, 2022

Related U.S. Application Data

(63) Continuation of application No. PCT/CN2021/109895, filed on Jul. 30, 2021.

(30) Foreign Application Priority Data

Jan. 4, 2021 (CN) .......................... 202110004478.1

(51) Int. Cl.
H10B 12/00  (2023.01)
(52) U.S. Cl.
CPC ................... H10B 12/482 (2023.02)
(58) Field of Classification Search
CPC ............................ H10B 12/482; H10B 12/485

USPC ......................................................... 438/262
See application file for complete search history.

(56) References Cited

U.S. PATENT DOCUMENTS

| 6,458,647 | B1 | 10/2002 | Tews |
| 6,689,623 | B2 | 2/2004 | Hong |
| 7,042,034 | B2 | 5/2006 | Hong |
| 8,853,660 | B2 * | 10/2014 | Han ................... H10B 63/32 |
| | | | 438/102 |
| 2003/0048593 | A1 | 3/2003 | Hong |
| 2004/0147088 | A1 | 7/2004 | Hong |

FOREIGN PATENT DOCUMENTS

| CN | 1312775 C | 4/2007 |
| CN | 102810463 A | 12/2012 |

* cited by examiner

*Primary Examiner* — Hoai V Pham
(74) *Attorney, Agent, or Firm* — Kilpatrick Townsend & Stockton LLP

(57) ABSTRACT

Provided are a memory and a method for manufacturing the same, and relates to the technical field of semiconductors. The manufacturing method of a memory comprises: providing a substrate; forming a plurality of sacrificial pillars arranged at intervals between each two adjacent ones of the bit line isolation walls; forming a supplementary layer on surfaces of the sacrificial pillars; performing ion implantation to the supplementary layer; etching the supplementary layer; forming insulating pillars between adjacent sacrificial pillars; removing the sacrificial pillars and the remaining supplementary layer; and forming a plurality of node contact plugs in the contact holes.

17 Claims, 31 Drawing Sheets

METHOD FOR MANUFACTURING A MEMORY USING A PLURALITY OF SACRIFICIAL PILLARS

CROSS-REFERENCE TO RELATED APPLICATIONS

The application is a continuation application of International Application No. PCT/CN2021/109895, filed on Jul. 30, 2021, which claims priority to Chinese Patent Application No. 202110004478.1, filed on Jan. 4, 2021. The disclosures of International Application No. PCT/CN2021/109895 and Chinese Patent Application No. 202110004478.1 are hereby incorporated by reference in their entireties.

BACKGROUND

A dynamic random access memory (DRAM) is a semiconductor memory for randomly writing in and reading data at high speed, and is widely applied to a data storage apparatus or device.

The DRAM may generally include a plurality of active areas with banded structures. The two ends of each of the active areas form node contact areas, and the middle area of each of the active areas forms a bit line contact area. In each of the active areas, a gate is set between the bit line contact area and each of the node contact areas, so that two metal oxide semiconductor field effect transistors (MOSFETs) with buried gate structures are formed on each of the active areas. Moreover, the node contact areas are connected with capacitors, and the capacitors and the node contact areas are connected by node contact plugs.

However, during the manufacturing process of the node contact plugs, the structure of the formed node contact plugs is incomplete, which affects the storage performance of the memory.

SUMMARY

The disclosure relates to the technical field of semiconductors, and in particular relates to a memory and a method for manufacturing the same.

The first aspect of the embodiment of the disclosure provides a manufacturing method of a memory, which may include the following operations. A substrate, on which a plurality of bit line isolation walls are parallel arranged, is provided. A plurality of sacrificial pillars arranged at intervals are formed between each two adjacent ones of the bit line isolation walls. A supplementary layer is formed on surfaces of the sacrificial pillars, at least covering facing side surfaces of the sacrificial pillars. Ion implantation is performed to the supplementary layer, in which an ion concentration of the supplementary layer decreases from top to bottom of the supplementary layer. The supplementary layer is etched, in which a thickness of the remaining supplementary layer decreases from top to bottom of the remaining supplementary layer. A plurality of insulating pillars are formed, each of which is between each two adjacent ones of the sacrificial pillars, in which side surfaces of the insulating pillars are in contact with the bit line isolation walls and the remaining supplementary layer. The sacrificial pillars and the remaining supplementary layer are removed, in which the insulating pillars and the bit line isolation walls jointly define a plurality of contact holes. A plurality of node contact plugs are formed in the contact holes.

A second aspect of the embodiment of the disclosure provides a memory, which includes: a substrate, on which a plurality of bit line isolation walls are parallel arranged, a plurality of node contact plugs provided at intervals arranged between each two adjacent ones of the bit line isolation walls, and insulating pillars which isolate each two adjacent ones of the node contact plugs, in which a size of ends, away from the substrate, of the node contact plugs is larger than or equal to a size of ends, close to the substrate, of the node contact plugs.

Technical features constituting the technical solutions and beneficial effects brought out by the technical features of these technical solutions, other technical problems solved by the memory and the manufacturing method thereof provided in the embodiments of the disclosure, other technical features included in the technical solutions and beneficial effects brought out by these technical features will be further described in detail in specific embodiments.

BRIEF DESCRIPTION OF THE DRAWINGS

In order to describe the technical solutions in the embodiments of the disclosure or the related art more clearly, the drawings required to be used in descriptions about the embodiments or the related art will be simply introduced below. It is apparent that the drawings described below are some embodiments of the disclosure. Other drawings may further be obtained by those of ordinary skilled in the art according to these drawings without creative work.

LIST OF THE REFERENCE SIGNS

100: Substrate; 101: Node contact area;
102: Active area; 103: Bit line contact area;
200: Bit line isolation wall; 201: Trench;
202: Bit line contact plug; 203: Bit line;
300: Sacrificial pillar; 301: Supplementary layer;
302: Sacrificial layer; 303: Mark layer;
304: Bar pattern; 305: Hole;
306: Photoresist layer; 400: Insulating pillar;
401: Contact hole; 402: Silicon nitride layer;
500: Node contact plug.

DETAILED DESCRIPTION

Figure 1A:
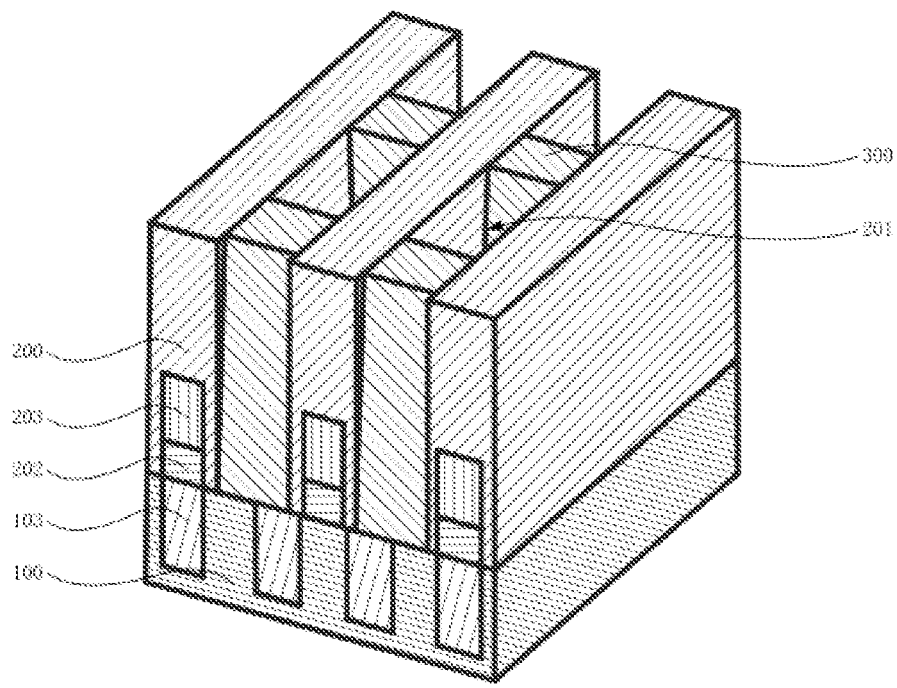
FIG. 1a is a first reference structural diagram of a memory in the related art.

In the related art, a memory is generally manufactured by the following method, which includes the following operations. Firstly, a plurality of mutually parallel bit line isolation walls are formed on a substrate, and trenches formed between two adjacent bit line isolation walls expose node contact areas located on the substrate. Then, a sacrificial pillar is formed on each of the node contact areas in each of the trenches, and the structure formed in this operation is shown in FIG. 1a. Herein a plurality of bit line isolation walls 200 are arranged on the substrate 100, each two adjacent ones of the bit line isolation walls 200 form a trench 201, and the node contact areas in the substrate 100 are exposed in the trench 201. Then, an insulating pillar is formed between each two adjacent ones of the sacrificial pillars 300 in each trench 201. Then, the sacrificial pillars 300 are removed to form contact holes exposing every corresponding node contact areas in the substrate 100 between every two adjacent insulating pillar in each trench 201. Then a node contact plug, which is in contact with the node contact area exposed in a contact hole, is formed in each contact hole, and a capacitor in contact with the node contact plug is formed on each node contact plug.

Figure 1B:
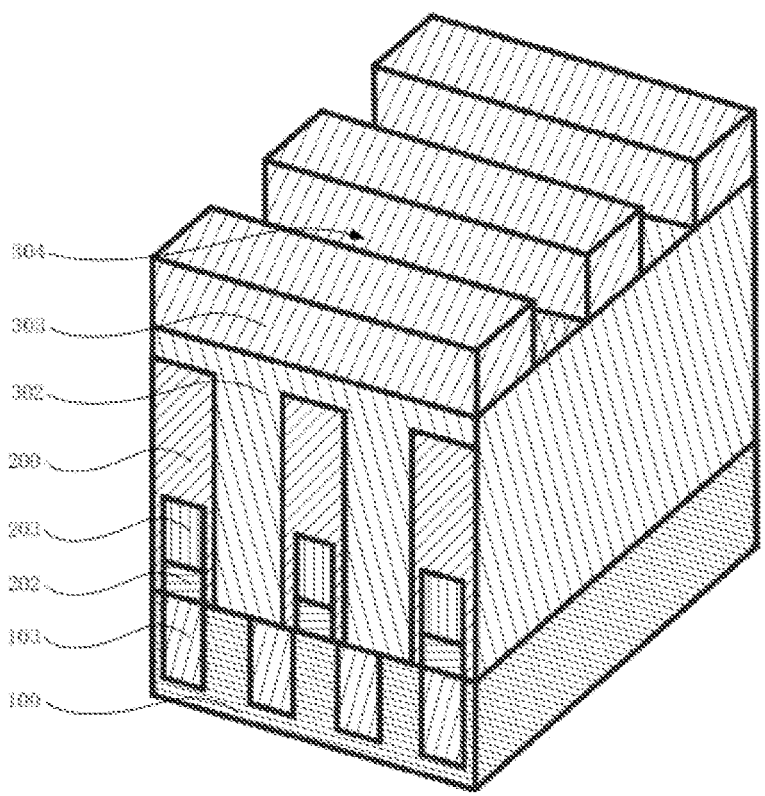
FIG. 1b is a second reference structural diagram of a memory in the related art.

According to the manufacturing method of a memory, the operation of forming a sacrificial pillar 300 on each node contact area in each trench 201 may include the following operations. Firstly, a silicon oxide layer 302 is formed in each trench 201, covering side surfaces and the surface away from the substrate 100 of each bit line isolation wall 200. Then, a mask layer 303 is formed on the silicon oxide layer 302, in which the mask layer 303 includes a plurality of parallel bar patterns 304, and the projections of the bar patterns 304 and the projections of the bit line isolation walls 200 on the substrate intersect, and the structure formed in this operation is shown in FIG. 1b. Then, the silicon oxide layer 302 located between the bit line isolation walls 200 is etched with the mask layer 303 having the bar patterns 304; the mask layer 303 and the silicon oxide layer 302 on the surfaces of the bit line isolation walls 200 away from the substrate 100 are removed, and the silicon oxide layer 302 in the trenches 201 is retained to form sacrificial pillars 300 located in the trenches 201.

However, the inventor of the application finds that, the structure of the node contact plug in the memory, manufactured by the above manufacturing method of a memory, is incomplete. The reason of this problem is that: when the silicon oxide layer 302 between the bit line isolation walls 200 is etched with the mask layer 303 having the bar patterns 304, the etching solution will not only remove the silicon oxide layer 302 at the staggered positions of the bar patterns 304 and the bit line isolation walls 200, but also etch the silicon oxide layer 302 covered by the mask layer 303 in the trenches 201; furthermore, the etching rate of the etching solution to the silicon oxide layer 302 covered by the mask layer 303 in the trenches 201 is less than the etching rate of the etching solution to the silicon oxide layer 302 exposed by the bar patterns 304 in the trenches 201, so that, the sacrificial pillars 300 formed by the silicon oxide layer 302 covered by the mask layer 303 in the trenches 201 have a sectional size (taking a plane perpendicular to the substrate 100 and parallel to the extension direction of the trenches 201 as a section) gradually increasing from a region away from the substrate 100 to a region close to the substrate 100. Therefore, the insulating pillars 400 subsequently formed between every two adjacent sacrificial pillars 300 in the trenches 201 have a sectional size gradually decreasing from a region away from the substrate 100 to a region close to the substrate 100. Therefore, after the sacrificial pillars 300 are subsequently removed, the contact holes formed in each trench 201 and each between each two adjacent ones of the insulating pillars 400 have an aperture size gradually increasing from a region away from the substrate 100 to a region close to the substrate 100. That is, the opening size of the contact holes is smaller than their bottom size, so that, when the node contact plugs, in contact with the node contact areas in the contact holes, are formed in the contact holes, the material forming the node contact plugs is not easy to enter the contact holes, which results in an increase of the probability that the material forming the node contact plug may not fill up the contact holes, thereby resulting in the incomplete structure of the node contact plugs, and decreasing the performance of the memory.

Therefore, the embodiment of the disclosure provides a manufacturing method of a memory. In the manufacturing method, a supplementary layer is formed on the sacrificial pillars, in which the ion concentration of the supplementary layer gradually decreases from a region away from a substrate to a region close to the substrate; furthermore, the supplementary layer is etched, such that the thickness of the supplementary layer gradually decreases from a region away from the substrate to a region close to the substrate; then, an insulating pillar is formed between two adjacent sacrificial pillars in gaps between every two adjacent bit line isolation walls, the section size of the insulating pillars gradually increases from a region away from the substrate to a region close to the substrate, so that, in contact holes formed by removing the sacrificial pillars and the supplementary layer, the aperture size of the contact holes gradually decreases from a region away from the substrate to a region close to the substrate, that is, the opening size of the contact holes is larger than the bottom size thereof, which makes it easier for a material forming the node contact plugs to enter the contact holes when the node contact plugs in contact with the node contact areas in the contact holes are formed in the contact holes, thus the structure of the formed node contact plugs is intact, and thus the performance of the memory is improved.

In order to make the above objectives, features and advantages of the embodiments of the disclosure more apparent and understandable, the technical solutions in the embodiments of the disclosure will be clearly and completely described below in combination with the drawings in the embodiments of the disclosure. It is apparent that the described embodiments are not all embodiments but merely part of them. On the basis of the embodiments of the disclosure, all other embodiments obtained by those of ordinary skilled in the art without creative work shall fall within the scope of protection of the disclosure.

Figure 2:
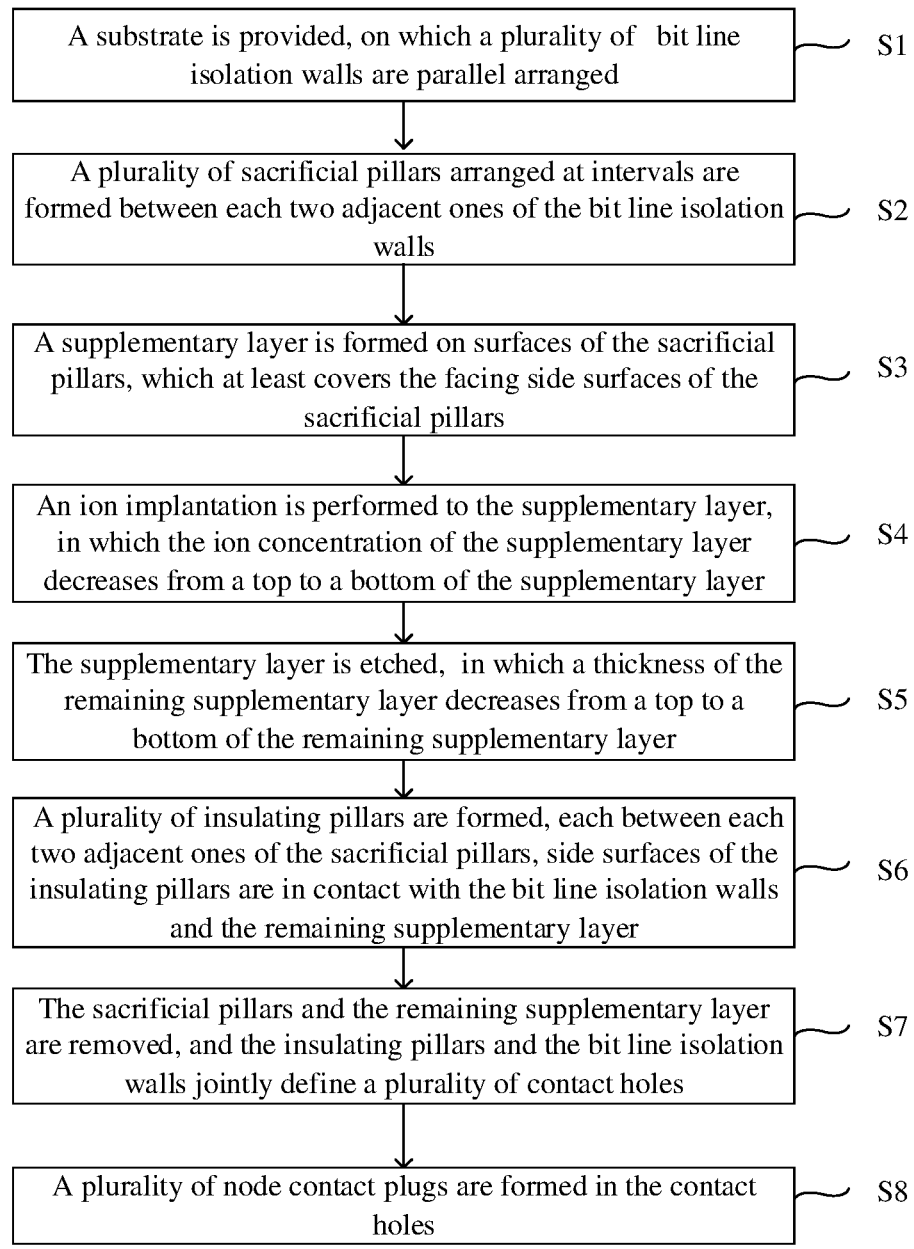
FIG. 2 is a flowchart of a manufacturing method of a memory according to an embodiment.

The embodiment provides a manufacturing method of a memory, which is used for manufacturing a memory, and for example, the manufacturing method is used for manufacturing a DRAM. Referring to FIG. 2, the manufacturing method includes the following operations.

Figure 3A:
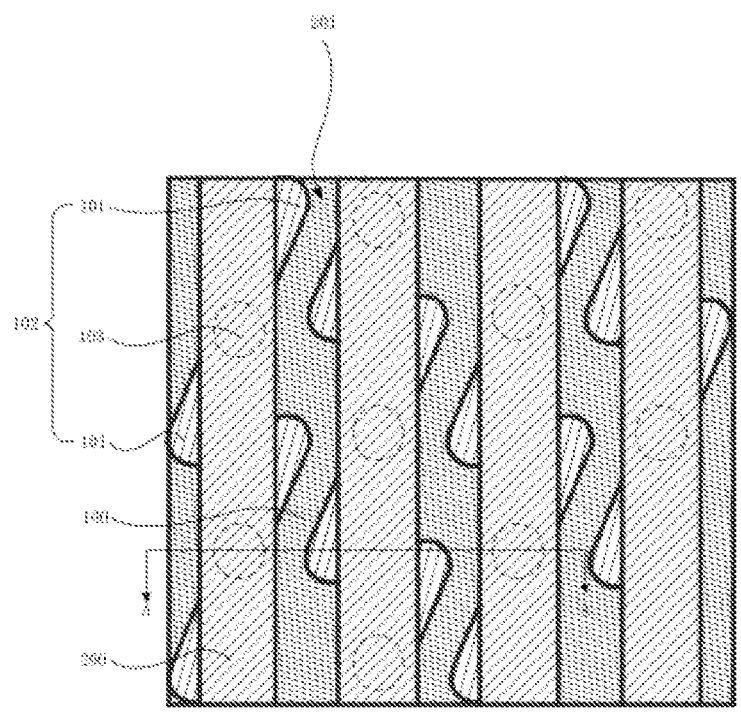
FIG. 3a is a schematic structural diagram of a memory after bit line isolation walls are arranged on a substrate according to an embodiment.

At S1, a substrate is provided. The structure of the substrate is shown in FIG. 3a, a plurality of mutually parallel bit line isolation walls 200 are arranged on the substrate 100, and the trenches 201 exposing the node contact areas 101 in the substrate 100 are formed between the adjacent bit line isolation walls 200.

Figure 6A:
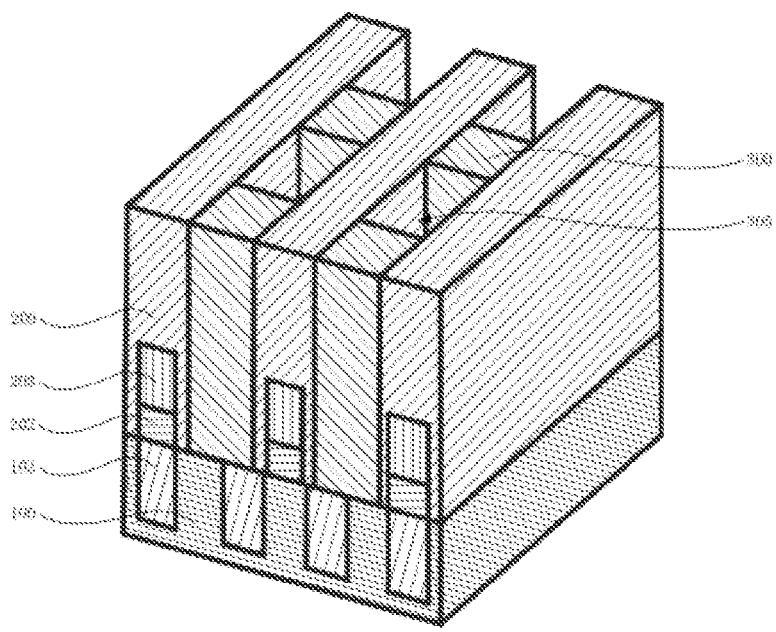
FIG. 6a is a first schematic structural diagram that sacrificial pillars are arranged on a substrate according to an embodiment.
Figure 6B:
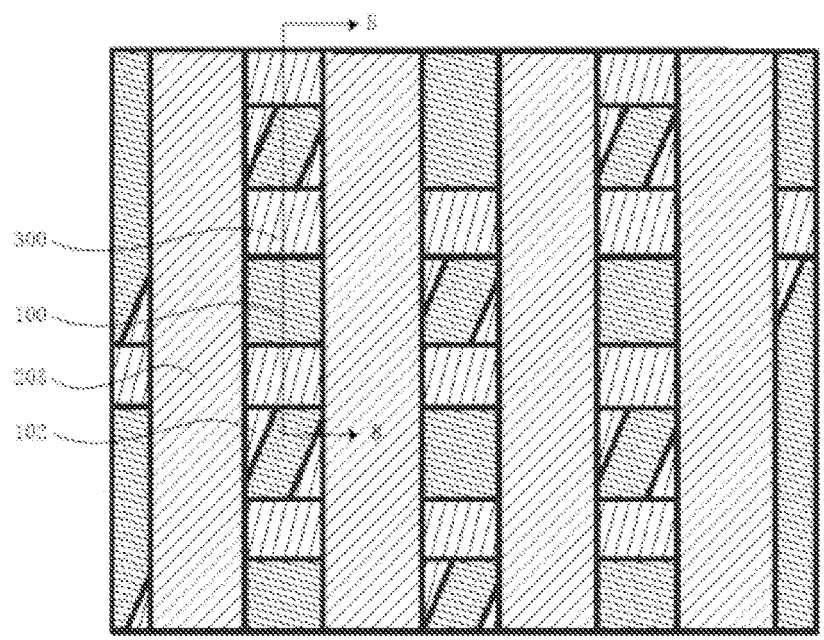
FIG. 6b is a second schematic structural diagram that sacrificial pillars are arranged on a substrate according to an embodiment.
Figure 6C:
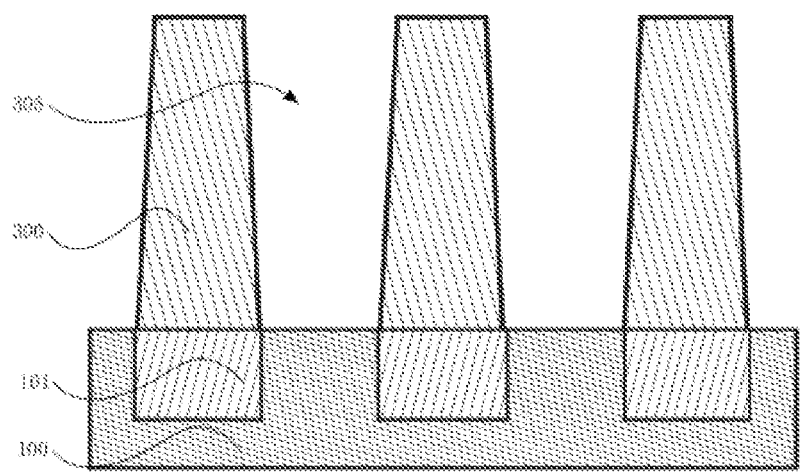
FIG. 6c is a sectional view of FIG. 6b at the BB line position.

At S2, a plurality of sacrificial pillars arranged at intervals are formed between each two adjacent ones of the bit line isolation walls 200, that is, one sacrificial pillar is formed on each node contact area 101 in each trench 201. The structure formed in this operation is shown in FIG. 6a, FIG. 6b and FIG. 6c. Each sacrificial pillar 300 is formed on a corresponding node contact area 101, that is, the sacrificial pillars 300 correspond to the node contact areas 101 one by one, and are in contact with the corresponding node contact areas 101.

Figure 7:
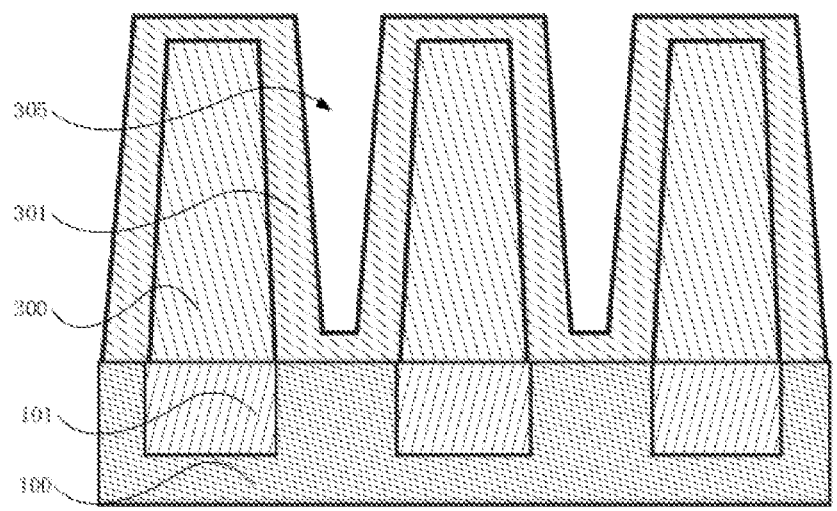
FIG. 7 is a schematic structural diagram that a supplementary layer is formed on the sacrificial pillars in FIG. 6c.

At S3, a supplementary layer is formed on the surface of each sacrificial pillar 300. The structure formed in this operation is shown in FIG. 7. The supplementary layer 301 at least covers the facing side surfaces of the sacrificial pillars 300, that is, the supplementary layer 301 at least covers the side surfaces of sacrificial pillars 300, and for example, the supplementary layer 301 covers the top surface and the side surfaces of the sacrificial pillars 300.

Figure 8A:
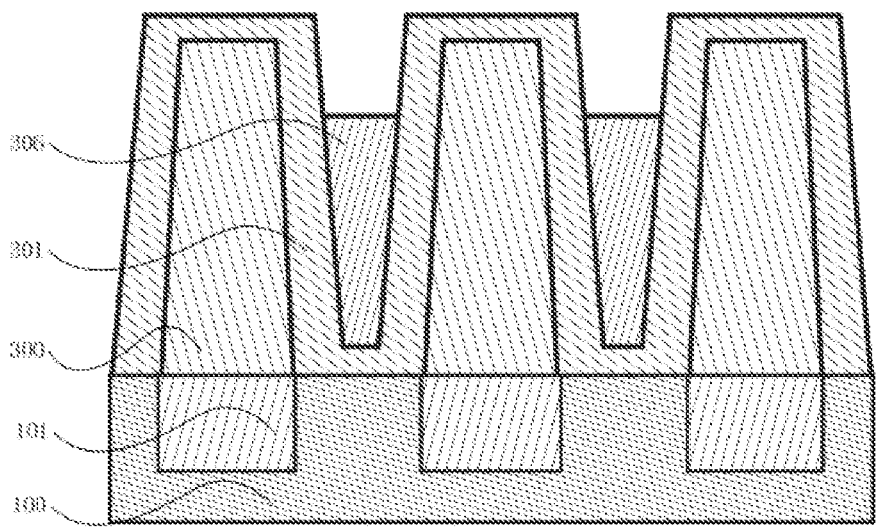
FIG. 8a is a schematic structural diagram showing the photoresist located on the supplementary layer shown in FIG. 7 that is etched back to a height of one third of the sacrificial pillars.
Figure 8B:
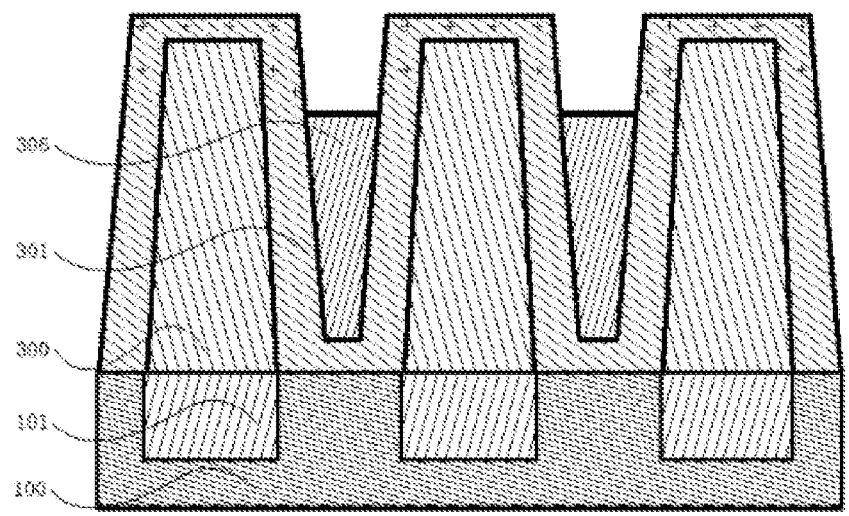
FIG. 8b is a schematic structural diagram of the supplementary layer in FIG. 8a after a first ion implantation.
Figure 8C:
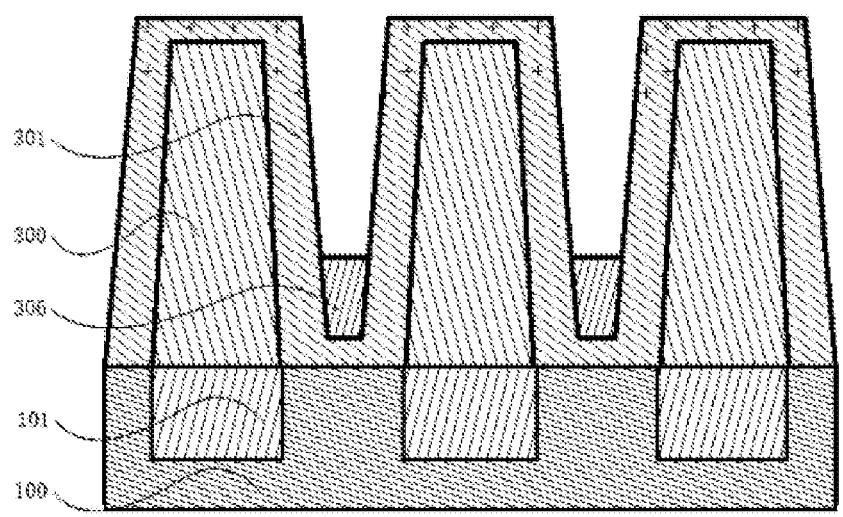
FIG. 8c is a schematic structural diagram show in the photoresist located on the supplementary layer shown in FIG. 8b that is etched back to a height of two thirds of the sacrificial pillars.
Figure 8D:
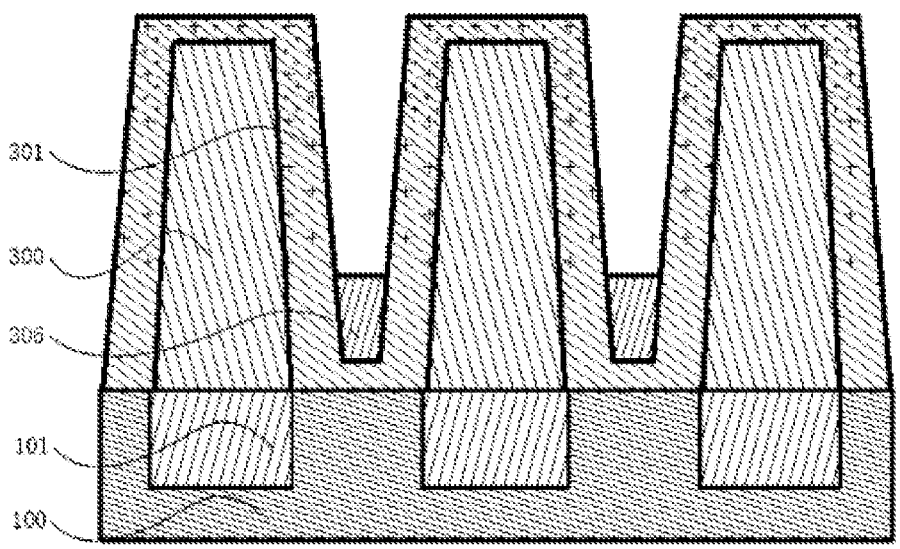
FIG. 8d is a schematic structural diagram of the supplementary layer in FIG. 8c after a second ion implantation.
Figure 8E:
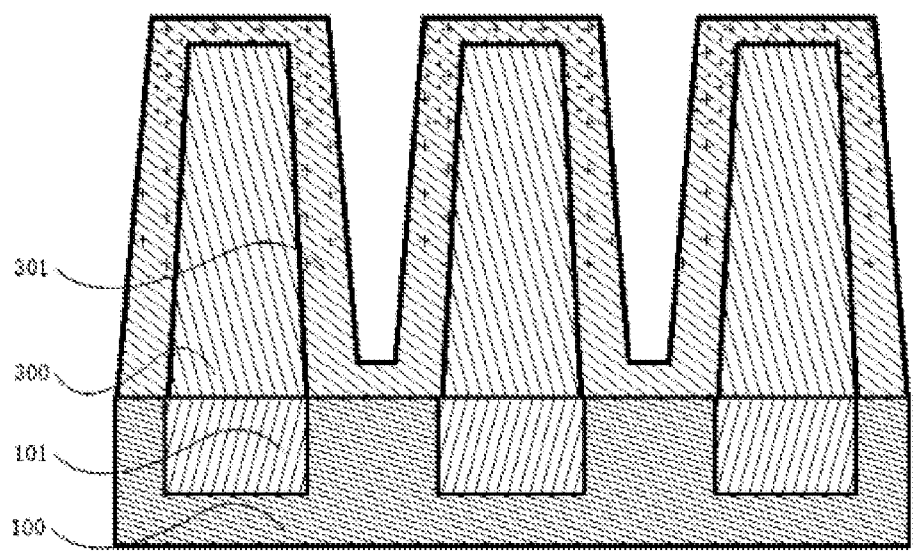
FIG. 8e is a schematic structural diagram after photoresist on the supplementary layer in FIG. 8d is completely removed.

At S4, an ion implantation is performed to the supplementary layer 301, thereby the ion concentration of the supplementary layer 301 from the top to the bottom of the supplementary layer 301. The structure formed in this operation is shown in FIG. 8e, in which "+" represents ions, and the concentration of "+" gradually decreases from top to bottom of the supplementary layer 301 shown in FIG. 8e.

Figure 9:
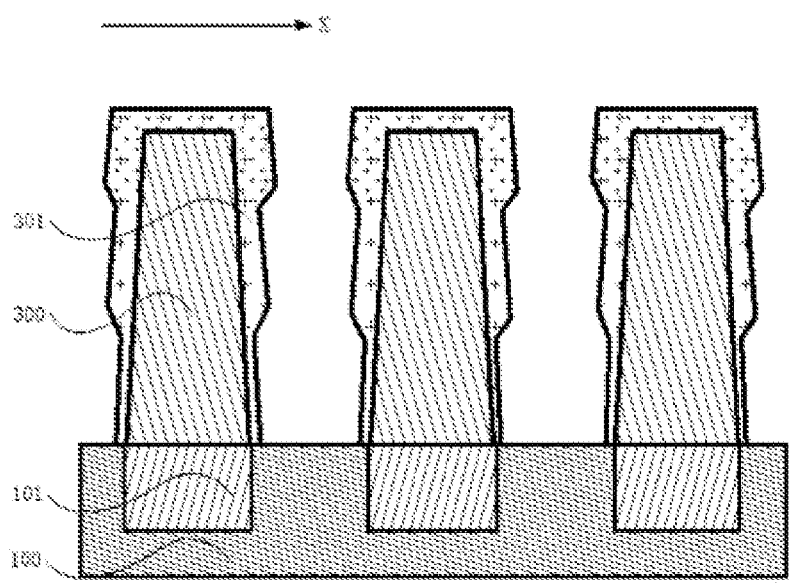
FIG. 9 is a schematic structural diagram after the supplementary layer in FIG. 8e is selectively etched.

At S5, the supplementary layer 301 is etched to reduce the thickness of the remaining supplementary layer 301 from top to bottom of the remaining supplementary layer 301, that is, the thickness of the supplementary layer 301 in a region close to the substrate 100 in the remaining supplementary layer 301 is less than the thickness of the supplementary layer 301 in a region away from the substrate 100 in the supplementary layer 301. The structure formed in this operation is shown in FIG. 9. The thickness of the supplementary layer 301 refers to the size of the supplementary layer 301 in the X direction shown in FIG. 9.

Figure 10A:
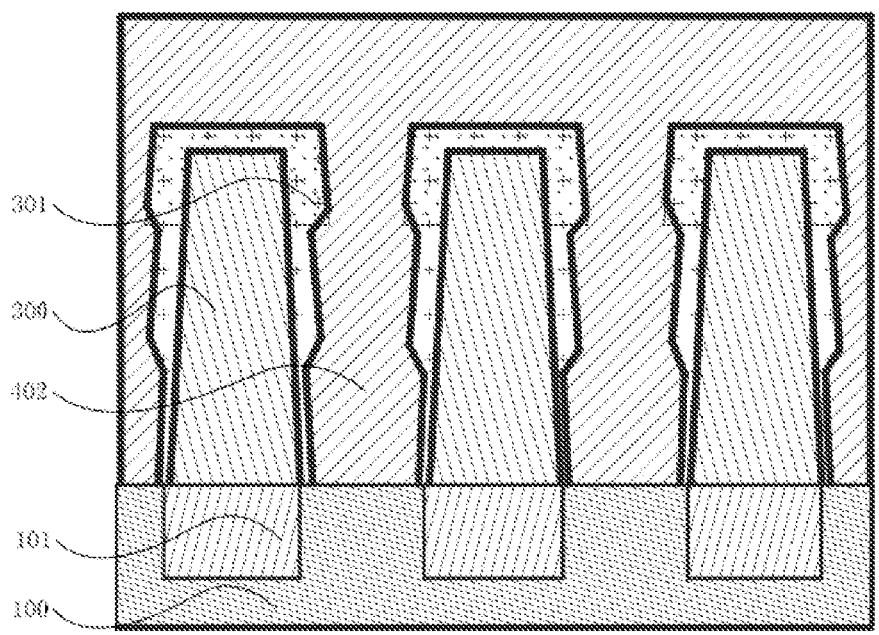
FIG. 10a is a schematic structural diagram after a silicon nitride layer is formed in the contact holes formed in FIG. 9.
Figure 10B:
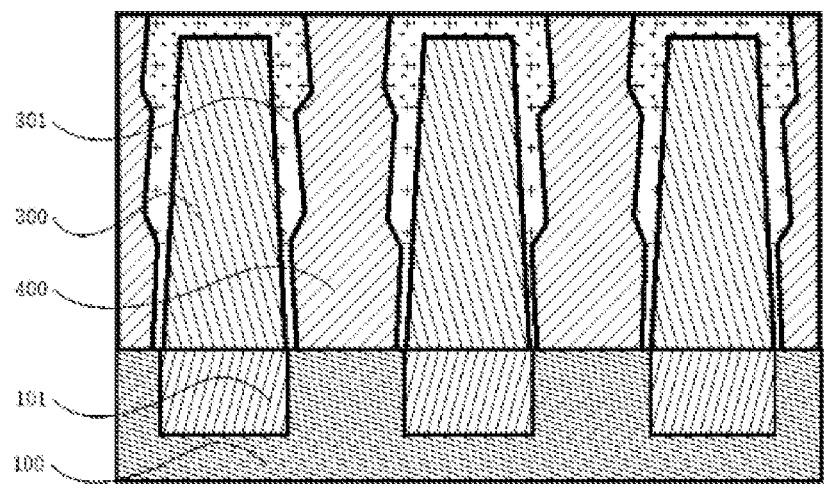
FIG. 10b is a schematic structural diagram after a part of silicon nitride in FIG. 10a is etched back.

At S6, the insulating pillars 400 are formed, each between each two adjacent ones of the sacrificial pillars 300 in each trench 201, side surfaces of the insulating pillars 400 are in contact with the remaining supplementary layer 301 on the two sacrificial pillars 300 adjacent to the insulating pillar 400 and are also in contact with the bit line isolation walls 200. The structure formed in this operation is shown in FIG. 10b. The insulating pillar 400 and the sacrificial pillar 300 are arranged at intervals, and side surfaces of the insulating pillars 400 and side surfaces of the sacrificial pillars 300 are isolated by the supplementary layer 301.

Figure 11A:
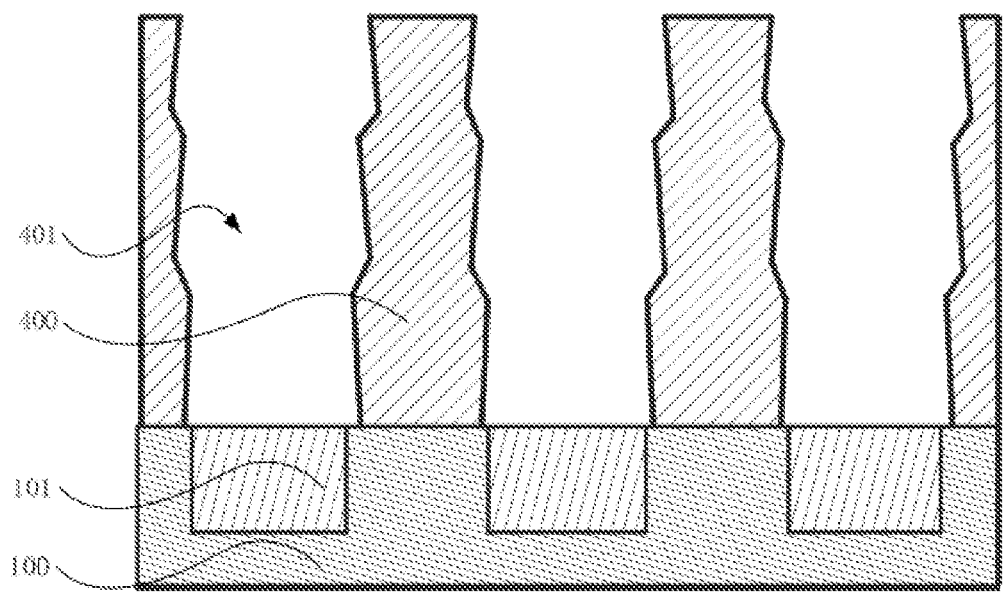
FIG. 11a is a schematic structural diagram after the sacrificial pillars and the supplementary layer in FIG. 10b are removed.

At S7, the sacrificial pillars 300 and the remaining supplementary layer 301 are removed to form the contact holes 401 in the trenches 201 and between every adjacent insulating pillars 400 in the trenches 201, that is, the insulating pillars 400 and the bit line isolation walls 200 jointly define a plurality of contact holes 401, and each contact hole 401 exposes a corresponding node contact area 101 in the substrate 100. The structure formed in this operation is shown in FIG. 11a. The contact holes 401 are formed between every adjacent insulating pillars 400, a plurality of contact holes 401 may be formed in one trench 201, and the plurality of contact holes 401 in one trench 201 and the plurality of node contact areas 101 exposed in the trench 201 are in one-to-one correspondence arrangement.

Figure 12:
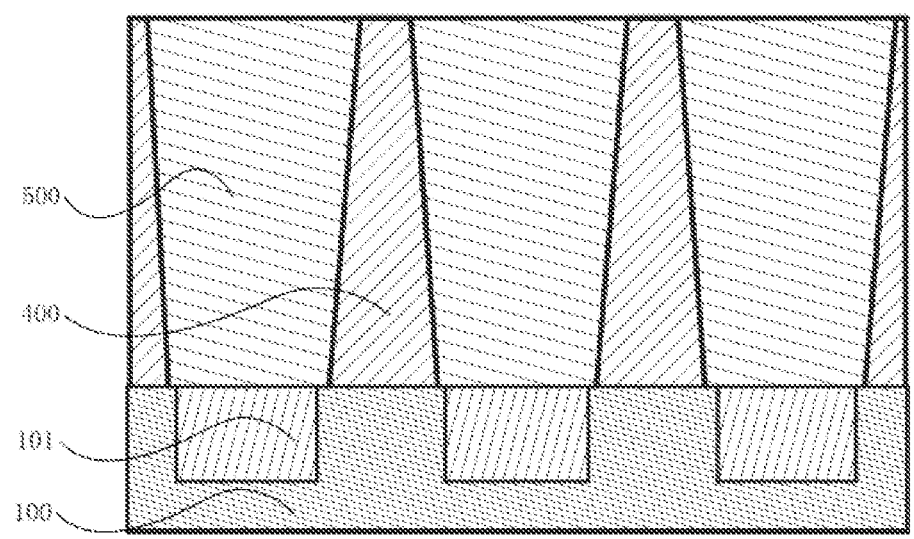
FIG. 12 is a structural view after node contact plugs are formed between adjacent insulating pillars in FIG. 11b.

At S8, a node contact plug 500 in contact with the corresponding node contact area 101 is formed in each contact hole 401. The structure formed in this operation is shown in FIG. 12, in which the node contact plugs 500 are formed in the contact holes 401 and are in contact with the node contact areas 101 exposed in the contact holes 401. In other words, in the same trench 201, each node contact plug 500 is arranged between every adjacent insulating pillars 400, that is, the node contact plugs 500 and the insulating pillars 400 are arranged at intervals.

After the node contact plug 500 in contact with the corresponding node contact area 101 is formed in each contact hole 401, a capacitor (not shown in the figure) may also be formed on each node contact plug 500, in which the capacitor is configured to store charges, and the node contact plug 500 is configured to electrically connect the node contact area 101 to the capacitor.

According to the manufacturing method of a memory provided in the embodiment of the disclosure, the plurality of mutually parallel bit line isolation walls 200 are arranged on the substrate 100, the plurality of sacrificial pillars 300 arranged at intervals are formed between the adjacent bit line isolation walls 200, the supplementary layer 301 is formed on the surfaces of the sacrificial pillars 300, after the ion implantation and the etching of the supplementary layer 301 are executed, the thickness of the remaining supplementary layer 301 decreases from the top to the bottom of the remaining supplementary layer 301, therefore, after the adjacent two sacrificial pillars 300 are provided with the supplementary layer 301, the distance between the supplementary layers 301 on adjacent sacrificial pillars 300 gradually increases from a region away from the substrate 100 to a region close to the substrate 100, and in the direction parallel to the bit line isolation walls 200, the size of the insulating pillars 400, filled between the supplementary layer 301 on the adjacent two sacrificial pillars 300 in the trench 201, gradually increases from a region away from the substrate 100 to a region close to the substrate 100, then, after the sacrificial pillars 300 and the supplementary layer 301 on the sacrificial pillars 300 are removed, the opening size of the contact holes 401, formed between two adjacent insulating pillars 400 in each trench 201, is larger than the bottom size of them. In this way, when the node contact plugs 500 are formed between every two adjacent insulating pillars 400 in the trenches 201, the material forming the node contact plugs 500 is easier to enter the contact holes 401 and fills up the contact holes 401, and thus the structures of the manufactured node contact plugs 500 are complete and the performance of the memory is improved.

Moreover, since the opening size of each contact hole 401 formed between two adjacent insulating pillars 400 in the trenches 201 is larger than the bottom size of them, compared with the related art in which the opening size of the contact holes 401 is smaller than the bottom size of them, the material for forming the node contact plug 500 fills the contact hole 401 faster, thereby improving the efficiency of manufacturing the node contact plugs 500.

Figure 3B:
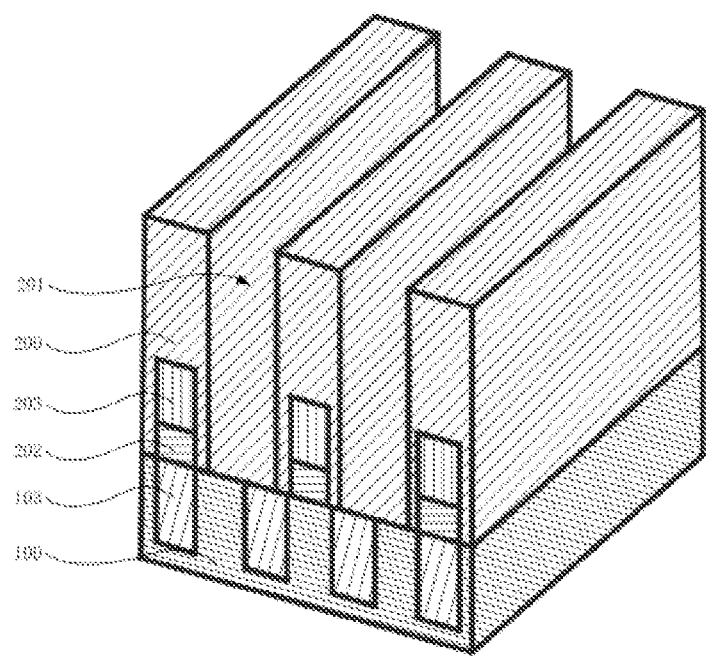
FIG. 3b is a three-dimensional schematic structural diagram of FIG. 3a after a disconnection at the AA line position.
Figure 3C:
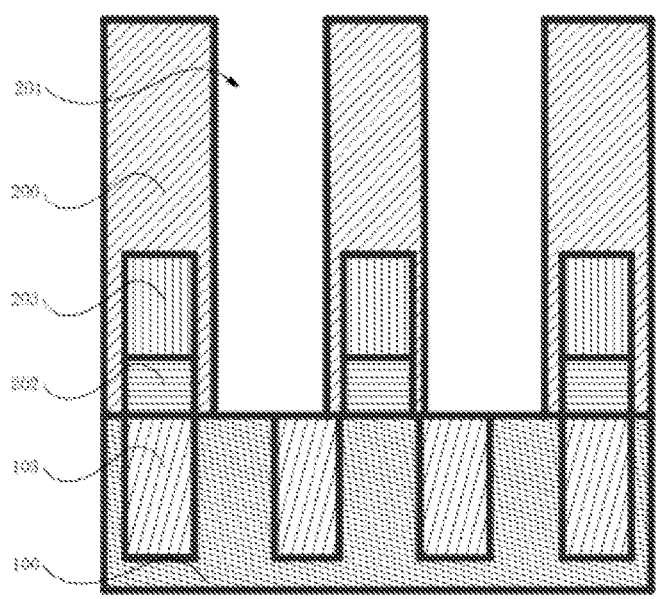
FIG. 3c is a front view of FIG. 3b.
Figure 3D:
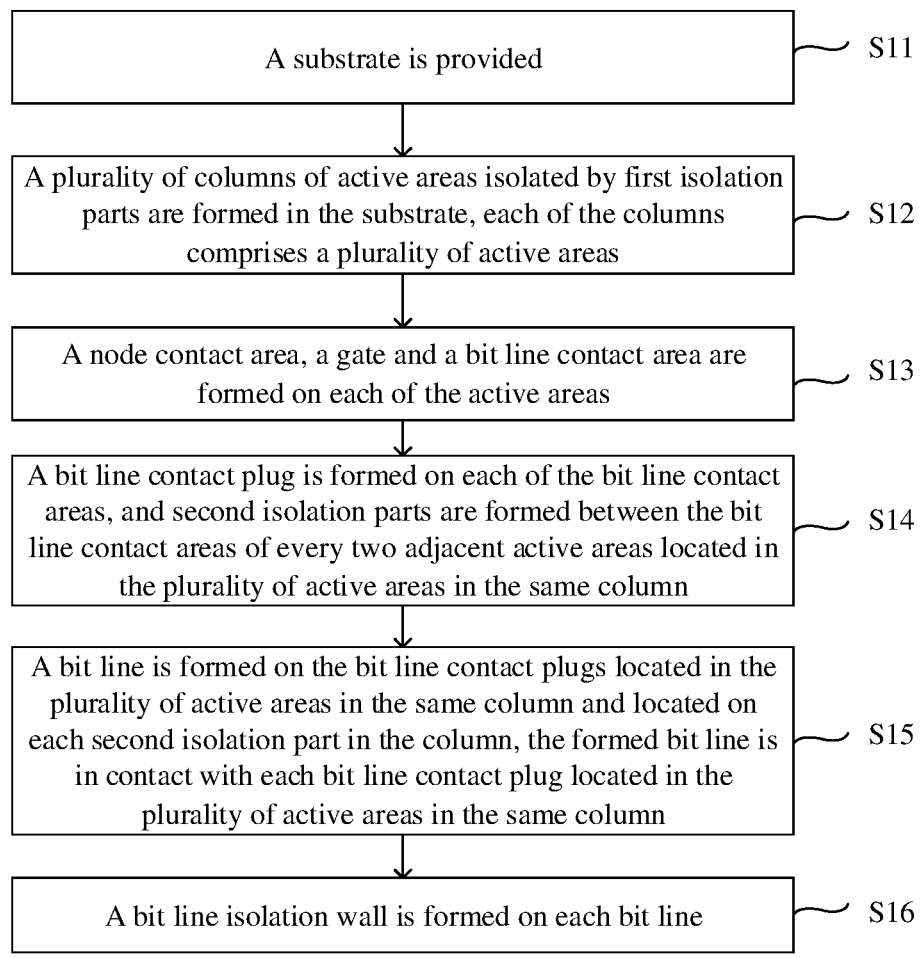
FIG. 3d is a manufacturing flowchart of bit line isolation walls according to an embodiment.

According to the above manufacturing method of a memory, as shown in FIG. 3d, the substrate 100 may be manufactured by the following method.

At S11, a substrate 100 is provided. The substrate 100 may be manufactured from materials such as silicon or germanium, and may be a circular or square plate structure. As shown in FIG. 3a, the substrate 100 is a square plate structure.

At S12, a plurality of columns of active areas 102 isolated by first isolation parts (not shown in the figure) are formed in the substrate 100. Each column of active areas 102 may include a plurality of active areas 102, as shown in FIG. 3a, and the plurality of active areas 102 are located in the substrate 100, and some areas of each active area 102, such as middle areas, are covered by bit line isolation walls 200 located above them. For example, the first isolation parts are manufactured by filling silicon dioxide in a groove formed in the substrate 100 by using a shallow trench isolation structure (STI) method. The first isolation parts are configured to isolate the adjacent active areas 102.

At S13, node contact areas 101, gates and a bit line contact area 103 are formed on each active area 102. The structure formed in this operation is shown in FIG. 3a, in which a gate is located between a node contact area 101 and a bit line contact area 103 on an active area 102, and the gate, the bit line contact area 103 and the node contact areas 101 on the same active area 102 form a transistor with a thin film structure.

In the above S13, the node contact area 101 and the bit line contact area 103 may be manufactured by the following process. Firstly, boron ions are doped in the substrate 100 made of a silicon material to form the active area 102 of a p-type semiconductor in the substrate 100, then doped ions such as phosphorus ions are doped into the source area 102 of the P-type semiconductor, and the node contact areas 101 and the bit line contact area 103 of an N-type semiconductor located in the active area 102 are formed.

The gate may be manufactured by the following process. Firstly, a gate groove is formed in the active area 102, and then a gate oxide layer, a gate isolation layer and a gate metal layer are sequentially deposited in the gate groove. The gate oxide layer, the gate isolation layer and the gate metal layer constitute the gate. For example, the gate oxide layer is silicon dioxide, the material of the gate isolation layer may include, but is not limited to, metal nitrides such as titanium nitride or tantalum nitride, and the material of the gate metal layer may include, but is not limited to, metals or metal alloys such as tungsten, aluminum, copper and their alloys.

In the above embodiment, the active areas 102 formed in the substrate 100 may be arranged in multiple columns, and each column may include a plurality of active areas 102; at the same time, the active areas 102 formed in the substrate 100 may also be arranged in multiple rows, and each row may include a plurality of active areas 102. That is, the active areas 102 formed in the substrate 100 may be arranged in an array to form a plurality of rows and columns of the active areas 102. Conductive parts are arranged in a first isolation part in the extension direction of each row of active areas 102. The gate on each active area 102 in a row of active areas 102 and each conductive part arranged in the first isolation part in the extension direction of the row of active areas 102 may jointly form a word line.

At S14, a bit line contact plug 202 is formed on each bit line contact area 103, each bit line contact plug 202 is in contact with a corresponding bit line contact area 103, in a plurality of active areas 102 located in the same column, a second isolation part (not shown in the figure) is formed between the bit line contact areas 103 of each two adjacent ones of the active areas 102, and the second isolation part is configured to isolate the two bit line contact plug 202 adjacent to it. The structure formed in this operation is shown in FIG. 3b and FIG. 3c. The bit line contact plug 202 is electrically connected with the bit line contact area 103. The bit line contact plug 202 may be made from doped polycrystalline silicon and metal.

At S15, a bit line 203 is formed on the bit line contact plug 202 located on each active area 102 in the same column and on each second isolation part in the column, so that the bit line 203 is in contact with each bit line contact plug 202 located in the same column at the same time. The structure formed in this operation is shown in FIG. 3b and FIG. 3c. Each bit line 203 is electrically connected with a plurality of bit line contact plugs 202 located in the same row. The bit line 203 may be made of materials such as tungsten, titanium and/or titanium nitride.

At S16, a bit line isolation wall 200 is formed on each bit line 203. These bit line isolation walls 200 are formed on the substrate 100, and these bit line isolation walls 200 are parallel to each other. Each bit line isolation wall 200 covers the surface of the bit line 203 and the side surfaces of the bit line contact plug 202, a trench 201 is formed between two adjacent bit line isolation walls 200, and each node contact area 10 on the substrate 100 is exposed in each trench 201. The structure formed in this step is shown in FIG. 3b and FIG. 3c. Each bit line 203 is electrically connected with the plurality of bit line contact plugs 202 located in the same row, and the bit line isolation wall 200 may be made from silicon nitride.

Figure 6D:
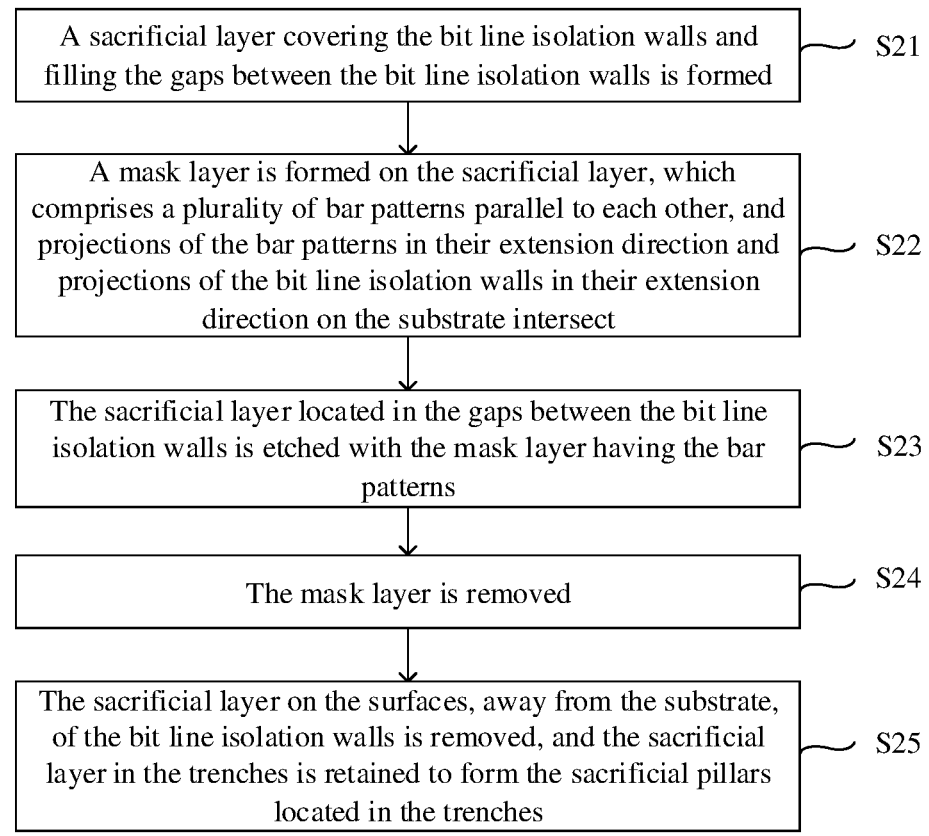
FIG. 6d is a first manufacturing flowchart of sacrificial pillars according to an embodiment.

According to the above manufacturing method of a memory, as shown in FIG. 6d, the sacrificial pillars 300 may be manufactured by the following process.

Figure 4A:
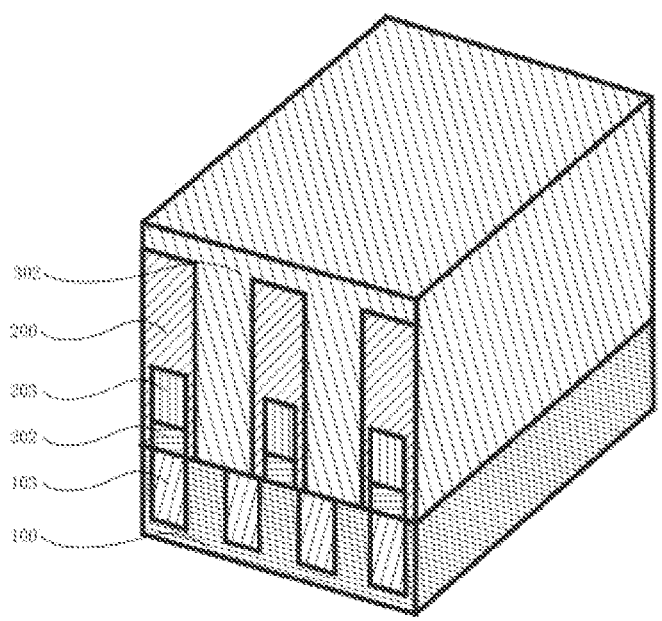
FIG. 4a is a first schematic structural diagram after a silicon oxide layer is arranged on a substrate according to an embodiment.

At S21, a sacrificial layer 302 covering the bit line isolation walls 200 and filling the gaps between the bit line isolation walls 200 is formed. Herein, the material of the sacrificial layer 302 may be silicon oxide. The structure formed in this operation is shown in FIG. 4a. The sacrificial layer is filled in each trench 201 and covers the surface, away from the substrate 100, of each bit line isolation wall 200.

Figure 5:
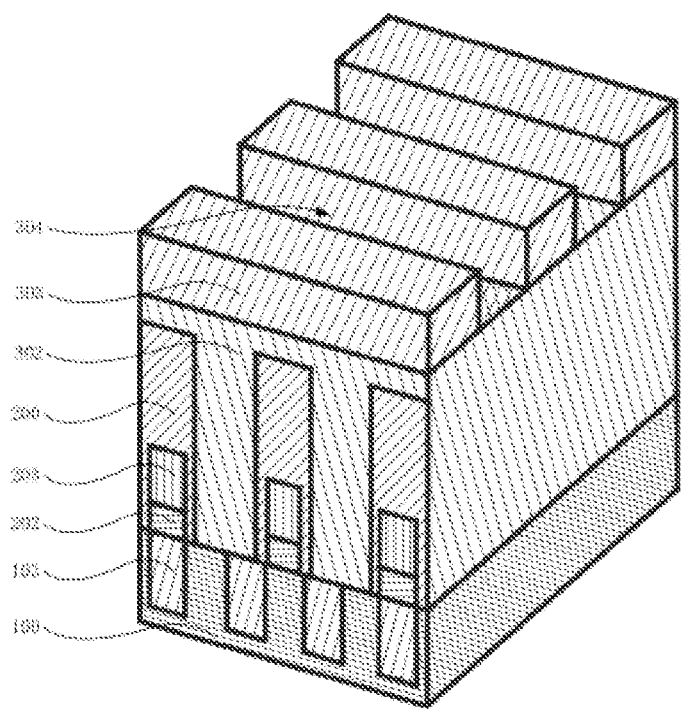
FIG. 5 is a schematic structural diagram after a mask layer is arranged on a silicon oxide layer on a substrate according to an embodiment.

At S22, a mask layer 303 is formed on the sacrificial layer 302. The mask layer 303 may include a plurality of bar patterns 304 parallel to each other. The projections of each bar pattern 304 in its extension direction and the projections of the bit line isolation walls in their extension direction on the substrate 100 intersect. The structure formed in this operation is shown in FIG. 5, in which the mask layer 303 covers the top surface of the sacrificial layer 302, furthermore, a plurality of bar patterns 304 are arranged in the mask layer 303, and each bar pattern 304 and each trench 201 are staggered arranged. Said staggered arranged means that the extension direction of the bar patterns 304 is set at an included angle relative to the extension direction of the trenches 201. The distances from the bar patterns 304 and from the trenches 201 to the substrate 100 are not equal, that is, the bar patterns 304 and the trenches 201 are located on two different layers, or they are arranged in different layers.

The mask layer 303 may be manufactured from a photoresist material. A preparation process of forming the bar pattern 304 on the mask layer 303 may be as follows. A patterned photoetching mask is arranged above the mask layer 303, and the pattern of the photoetching mask is copied on the mask layer 303 by exposure and development. In this way, the bar patterns 304 are formed from the mask layer 303.

At S23, the sacrificial layer 302 located in the gaps between the bit line isolation walls 200 is etched with the mask layer 303 with the bar patterns 304, the sacrificial layer 302 corresponding to intersection areas of the bar patterns 304 and the trenches 201 is removed, and the etching depth of these areas reaches the substrate 100 to form holes in the intersection areas of the bar patterns 304 and the trenches 201. In addition, the sacrificial layer 302 corresponding to the bit line isolation walls 200 are removed, but the bit line isolation walls 200 are not etched, or the etching rate of the bit line isolation walls 200 is much less than that of the sacrificial layer 302, so that the etching depth of these areas reaches the bit line isolation walls 200.

At S24, the mask layer 303 is removed by performing exposure treatment at first, in which a photochemical reaction occurs in the mask layer 303, and developing the mask layer 303 subsequently.

At S25, the sacrificial layer 302 on the surfaces, away from the substrate 100, of the bit line isolation walls 200 is removed, and the sacrificial layer 302 in the trenches 201 is retained to form the sacrificial pillars 300 located in the trenches 201. In this operation, the sacrificial layer 302 on the surfaces, away from the substrate 100, of the bit line isolation walls 200 may be removed by etching. The formed structure is shown in FIG. 6a, FIG. 6b and FIG. 6c, in which each hole 305 and each sacrificial pillar 300 are located in corresponding trenches 201, and the holes 305 and the sacrificial pillars 300 in the same trench 201 are arranged alternately.

In the embodiment, the sacrificial layer 302 is etched with the bar patterns 304 of the mask layer 303 to obtain the sacrificial pillars 300. A windowing area of the bar patterns 304 is larger than an intersection area of the bar patterns 304 and the trenches 201. Therefore, the pattern of the manufactured photoetching mask is simpler, the photoetching mask is easier to be prepared, and the bar patterns 304 of the mask layer 303 is easier to be formed.

Figure 6E:
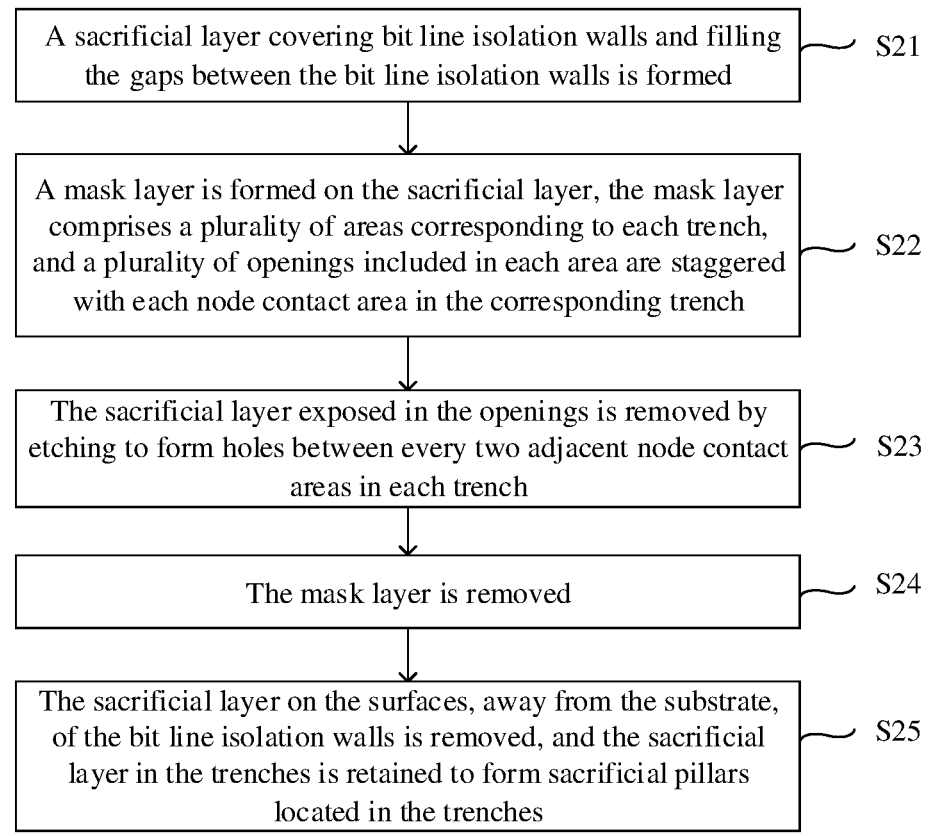
FIG. 6e is a second manufacturing flowchart of sacrificial pillars according to an embodiment.

In other embodiments, as shown in FIG. 6e, the sacrificial pillars 300 may be manufactured by the following process.

At S21, a sacrificial layer 302 covering the bit line isolation walls 200 and filling the gaps between the bit line isolation walls 200 is formed. The sacrificial layer 302 covers the surface, away from the substrate 100, of each bit line isolation wall 200. The structure formed in this operation is shown in FIG. 4a. The sacrificial layer 302 fills in each trench 201 and covers the surface, away from the substrate 100, of each bit line isolation wall 200.

At S22, a mask layer 303 is formed on the sacrificial layer 302. For example, the material of the sacrificial layer 302 may be silicon oxide. The mask layer 303 includes a plurality of areas corresponding to each trench 201, and a plurality of openings included in each of the areas are staggered with the node contact areas 101 in the corresponding trench 201. Staggered arrangement means that projections, on the substrate 100, of the plurality of openings included in each of the areas are not superposed with each of the node contact areas 101 in the corresponding trench 201, and each of the node contact areas 101 in the same trench 201 and projections, on the substrate 100, of each opening are alternately arranged along the extension direction of the trench 201.

The mask layer 303 may be manufactured from a photoresist material. A preparation process of forming openings on the mask layer 303 may be as follows. A graphical photoetching mask is arranged on the mask layer 303, and the pattern of the photoetching mask is copied on the mask layer 303 by exposure and development. In this way, a plurality of openings are formed on the mask layer 303.

At S23, the sacrificial layer 302 exposed in the openings is removed by etching to form holes between every two adjacent node contact areas 101 in each trench 201. In this operation, the sacrificial layer 302 exposed by the openings is etched away, and the sacrificial layer 302 shielded by the mask layer 303 is hardly etched. In this way, holes in one-to-one correspondence with the openings are formed in the trenches 201.

At S24, the mask layer 303 is removed by performing exposure treatment at first, in which a photochemical reaction occurs in the mask layer 303, and developing the mask layer 303 subsequently.

At S25, the sacrificial layer 302 on the surfaces, away from the substrate 100, of the bit line isolation walls 200 is removed, and the sacrificial layer 302 in the trenches 201 is retained to form the sacrificial pillars 300 located in the trenches 201. In this operation, the sacrificial layer 302 on the surfaces, away from the substrate 100, of the bit line isolation walls 200 may be removed by etching. The formed structure is shown in FIG. 6a, FIG. 6b and FIG. 6c, each hole 305 and each sacrificial pillar 300 are located in corresponding trenches 201, and the holes 305 and the sacrificial pillars 300 in the same trench 201 are arranged alternately.

In the embodiment, when the sacrificial layer 302 is etched by using the openings of the mask layer 303, the structure of the bit line isolation walls 200 may be kept intact when the sacrificial layer 302 is etched, which is conducive to effectively insulating the bit lines 203 and the bit line contact plugs 202 by the bit line isolation walls 200.

Figure 6F:
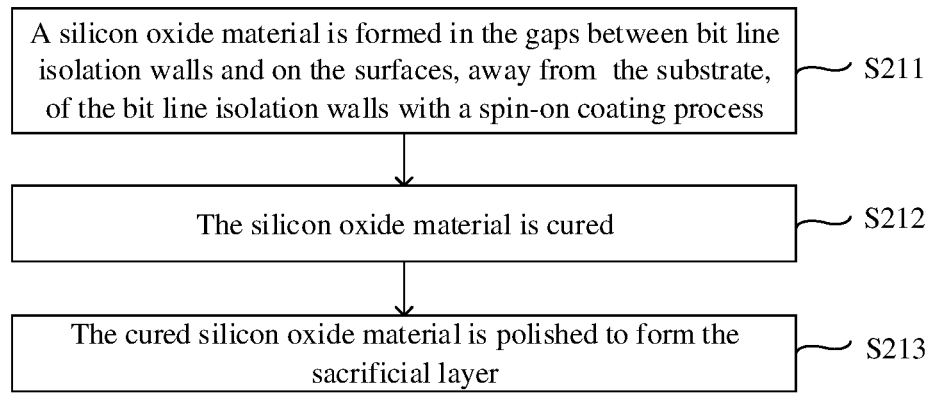
FIG. 6f is a manufacturing flowchart of a silicon oxide layer according to an embodiment.

The sacrificial layer 302 covering the bit line isolation walls 200 and filling the gaps between the bit line isolation walls 200 may be prepared by the following process, by referring to FIG. 6f.

Figure 4B:
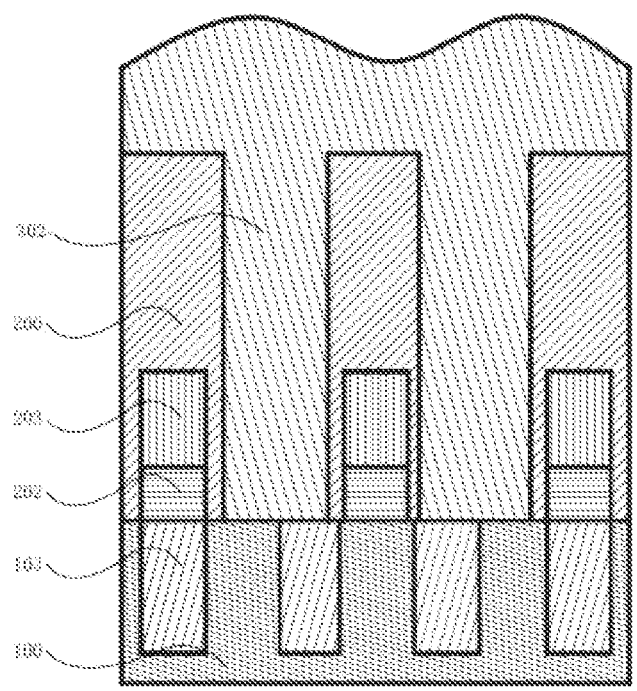
FIG. 4b is a second schematic structural diagram after a silicon oxide layer is arranged on a substrate according to an embodiment.
Figure 4C:
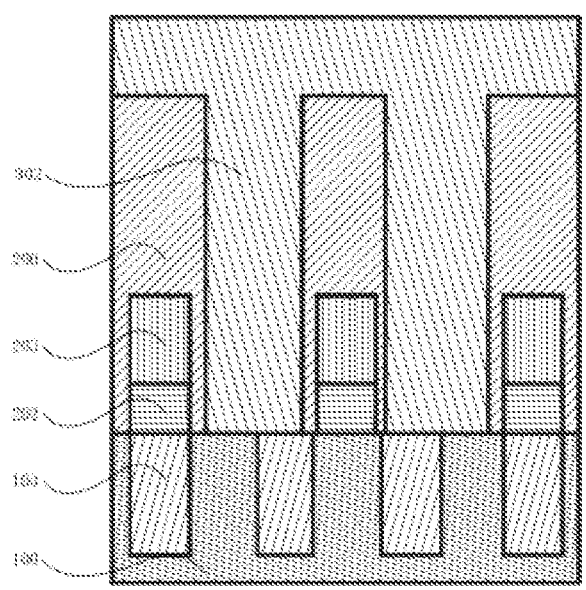
FIG. 4c is a third schematic structural diagram after a silicon oxide layer is arranged on a substrate according to an embodiment.

At S211, by adopting a spin-on coating process, a silicon oxide material is formed in the gaps between the bit line isolation walls 200 and on the surfaces, away from the substrate 100, of the bit line isolation walls 200. The spin-on coating refers to a process of evenly laying a sol, a solution or a suspension on the surface of a substrate 100 by utilizing the centrifugal force generated by spinning. The spin-on coating process may be used for quickly coating the silicon oxide material. The structure formed in this operation is shown in FIG. 4b, and the surface, away from the substrate 100, of the silicon oxide material is an uneven surface.

At S212, the silicon oxide material is cured. For example, the curing treatment may be an annealing treatment, and the silicon oxide material can be fixed and shaped by curing it.

At S213, the cured silicon oxide material is polished to form the sacrificial layer. For example, the polishing treatment may be chemical mechanical polishing. Polishing of the silicon oxide material may make the surface, away from the substrate 100, of the silicon oxide material flat. Referring to the structural diagrams 4a and 4c formed in this operation, the surface, away from the substrate 100, of the silicon oxide material is a flat surface.

In the manufacturing method of a memory in the embodiment, the supplementary layer 301 is thus formed that a polysilicon material may be deposited on each of the sacrificial pillars 300, the holes 305 and the bit line isolation walls 200 by a low-pressure chemical vapor deposition process. The deposited polysilicon material forms the supplementary layer 301. The structure formed in this operation is shown in FIG. 7. The supplementary layer 301 covers each of the sacrificial pillars 300, the holes 305 and the bit line isolation walls 200.

When the polysilicon material is deposited by the low-pressure chemical vapor deposition process, the reaction temperature is between 380° C. and 500° C., the reaction pressure is between 1 Torr and 3 Torr, and the used reaction gas is one of $H_3SiN(C_3H_7)_2$, $Si_2H_6$ (ethylsilane) and $SiH[N(CH_3)_2]_3$. The thickness D of the formed supplementary layer 301 is between ¼ L and ⅓ L, in which L is the minimum distance between the bottom side walls of two adjacent sacrificial pillars 300 in the same trench 201, and the minimum distance is the distance between the lower parts of the side surfaces of the two adjacent sacrificial pillars 300 facing each other.

Figure 8F:
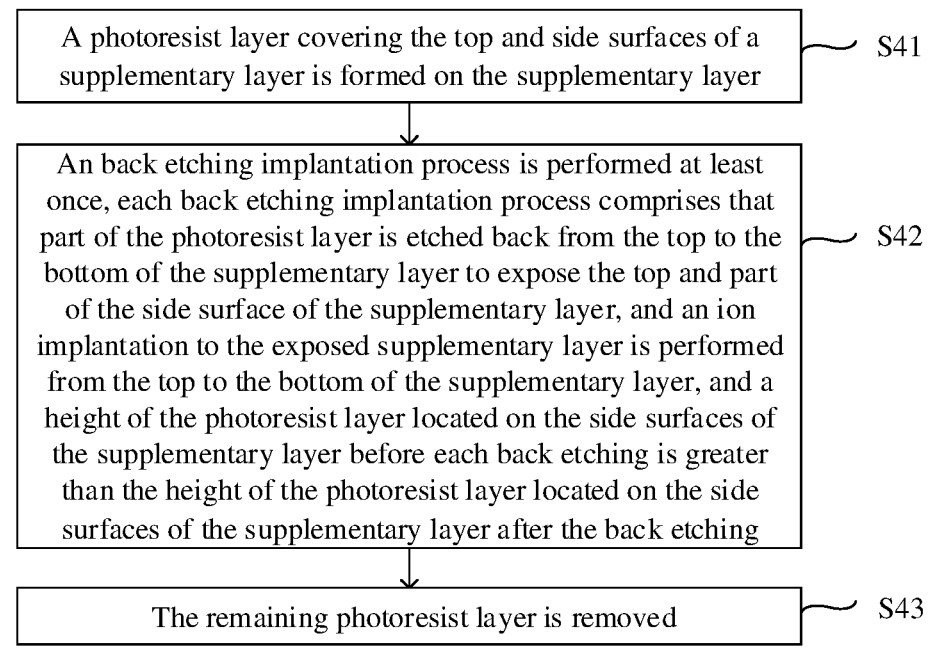
FIG. 8f is a manufacturing flowchart of an ion implantation to a supplementary layer according to an embodiment.

According to the manufacturing method of a memory in the embodiment, referring to FIG. 8f, ion implantation is performed to the supplementary layer 301 by the following process.

At S41, a photoresist layer covering the top and the side surfaces of the supplementary layer 301 is formed on the supplementary layer 301. In this operation, the photoresist layer may be formed on the supplementary layer 301 by a spin-on coating process.

At S42, a back etching implantation process is performed at least once. Each back etching implantation process may include the following operations. Part of the photoresist layer is etched back in the direction from the top to the bottom of the supplementary layer 301 to expose the top and part of the side surfaces of the supplementary layer 301, and ion implantation into the exposed supplementary layer 301 is performed in the direction from the top to the bottom of the supplementary layer 301 The height of the photoresist layer located on the side surfaces of the supplementary layer 301 before each back etching is greater than that after the back etching. Herein when the photoresist layer is etched back, the photoresist layer may be exposed at first and then developed by an optical method, and the photoresist layer can be etched back. Certainly, the photoresist layer may be etched by adopting oxygen plasma.

Performing the back etching implantation process at least once may include multiple back etching implantation processes. For example, in some embodiments, performing the back etching implantation process at least once may include performing the back etching implantation processes twice.

When the photoresist layer is etched back for the first time, the photoresist layer at the top of the sacrificial pillar 300 needs to be removed so that the ion implantation is subsequently performed to the supplementary layer 301 from the top of the supplementary layer 301. In some embodiments, when the photoresist layer is etched back for the first time, besides removing of the photoresist layer located at the top of the sacrificial pillar 300, part of the photoresist layer located on the side surfaces of the sacrificial pillars 300 is also removed, so that part of the supplementary layer 301 on the side surfaces of the sacrificial pillars 300 is exposed to facilitate the first ion implantation. After the photoresist layer is etched back for the first time, the height of the retained photoresist layer is ⅔ of the height of the sacrificial pillars 300 (as shown in FIG. 8a). When the first ion implantation is performed to the supplementary layer 301 from the top of the supplementary layer 301, the depth of ions implanted into the supplementary layer 301 is ⅓ of the height of the sacrificial pillars 300 (as shown in FIG. 8b).

When the photoresist layer is etched back for the second time, based on the supplementary layer 301 retained after the photoresist layer is etched back for the first time, the photoresist layer of a certain height is removed in the direction from the top to the bottom of the supplementary layer 301, so as to reduce the height of the photoresist layer located on the side surfaces of the sacrificial pillars 300, and further expose a larger area of the supplementary layer 301 located on the side surfaces of the sacrificial pillars 300, to facilitate the second ion implantation. After the photoresist layer is etched back for the second time, the height of the retained photoresist layer is ⅓ of the height of the sacrificial pillars 300 (as shown in FIG. 8c). When the second ion implantation is performed from the top of the supplementary layer 301 to the supplementary layer 301, the depth of ions implanted to the supplementary layer 301 is ⅔ of the height of the sacrificial pillars 300 (as shown in FIG. 8d).

When ion implantation is performed to the exposed supplementary layer 301 in the direction from the top to the bottom of the supplementary layer 301, the implanted ions may be phosphorus or boron. The depth of ions implanted into the supplementary layer 301 refers to the longest distance of the ions to the top of the supplementary layer 301 when the ions are implanted into the supplementary layer 301 from the top of the supplementary layer 301. By implanting phosphorus or boron into the supplementary layer 301, the etching rate of the supplementary layer 301 can be reduced.

At S43, the remaining photoresist layer is removed. An oxygen plasma etching may be used to remove it, so that the etching process has strong controllability and good consistency. The structure formed in this operation is shown in FIG. 8e. Ions are doped in the supplementary layer 301, and the concentration of the ions doped in the supplementary layer 301 gradually decreases from the top, away from the substrate 100, of the supplementary layer 301 to the bottom, close the substrate 100, of the supplementary layer 301, so that, when the supplementary layer 301 is etched subsequently, the etching rate of the supplementary layer 301 at different regions corresponds to different ion concentrations therein, and the higher the ion concentration in a region is, the slower the etching rate of the supplementary layer 301 is.

According to the manufacturing method of a memory in the embodiment, when the supplementary layer 301 is selectively etched, the used etching solution is one of an $NH_4OH$ solution (ammonium hydroxide) or a KOH solution (potassium hydroxide). The structure formed after etching the supplementary layer 301 is shown in FIG. 9, in which the thickness of the supplementary layer 301 in the region close to the substrate 100 in the etched supplementary layer 301 is less than that of the supplementary layer 301 in the region away from the substrate 100 in the supplementary layer 301.

Figure 10C:
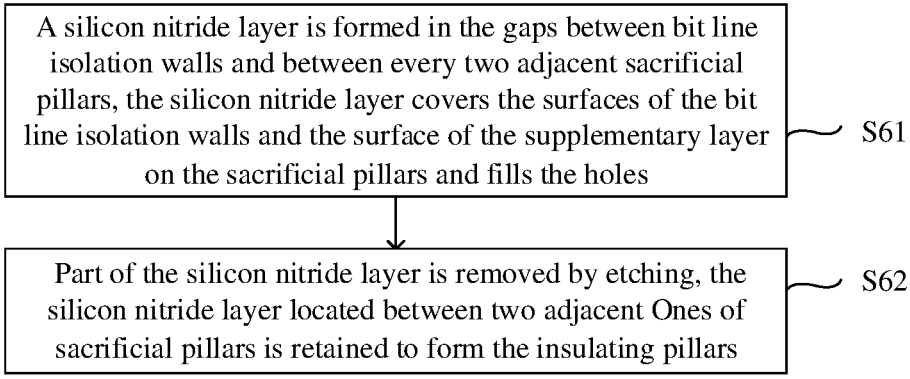
FIG. 10c is a manufacturing flowchart of insulating pillars according to an embodiment.

According to the manufacturing method of a memory in the embodiment, please refer to FIG. 10c, the insulating pillars 400 may be prepared by the following process.

At S61, a silicon nitride layer 402 is formed in the gaps between the bit line isolation walls 200 and between every two adjacent sacrificial pillars 300. The silicon nitride layer 402 covers the surfaces of the bit line isolation walls 200 and the surface of the supplementary layer 301 on the sacrificial pillars 300 and fills up the holes. The structure formed in this operation is shown in FIG. 10a. The silicon nitride layer 402 fills in each trench 201, covers the surfaces of the bit line isolation walls 200 and the surface of the supplementary layer 301 on the sacrificial pillars 300, and fills up the holes.

In the above S61, the silicon nitride layer 402 may be formed in the gaps between bit line isolation walls 200 and between every two adjacent sacrificial pillars 300 by either a low-pressure chemical vapor deposition process or an atomic deposition process. When the silicon nitride layer 402 is formed in the gaps between the bit line isolation walls 200 and between every two adjacent sacrificial pillars 300 with the low-pressure chemical vapor deposition process, the used reaction gas is one of $SiH_4$ (silane, also known as silicon tetrahydride) or $SiH_2Cl_2$ (dichlorosilane). When the silicon nitride layer 402 is formed in the gaps between the bit line isolation walls 200 and between every two adjacent sacrificial pillars 300 with the atomic deposition method, the used reaction gas is one of a mixture of $N_2$ (nitrogen) and $H_2$ (hydrogen) or $NH_3$ (ammonia).

At S62, part of the silicon nitride layer 402 is removed by etching, and the silicon nitride layer 402 located between two adjacent sacrificial pillars 300 is retained, that is, the silicon nitride layer 402 in the holes is retained, which forms insulating pillars 400. The structure formed in this operation is shown in FIG. 10b. The insulating pillars 400 and the sacrificial pillars 300 in the same trench 201 are arranged at intervals, and each insulating pillar 400 is separated from the sacrificial pillar 300 close to it by the supplementary layer 301.

Figure 11B:
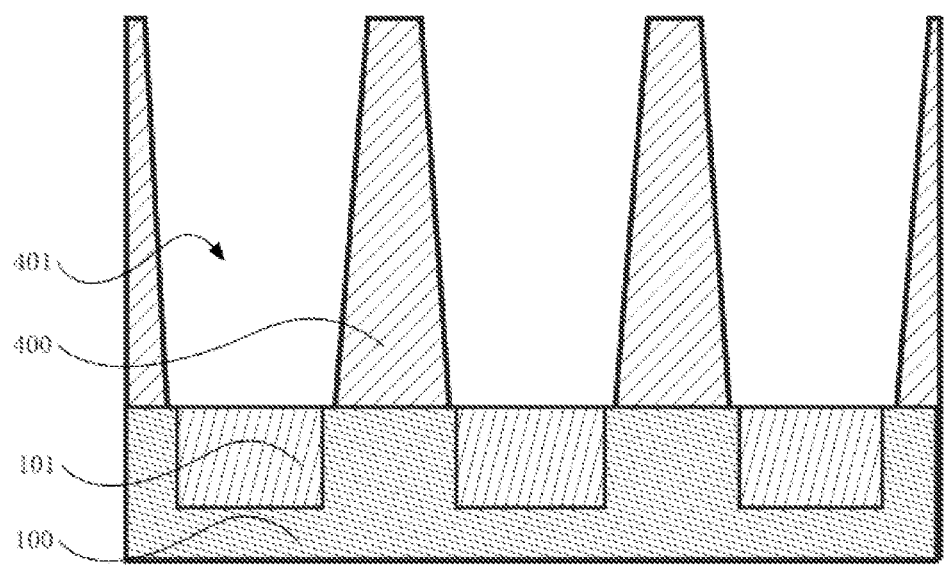
FIG. 11b is a schematic structural diagram after the insulating pillars in FIG. 11a are etched.

According to the manufacturing method of a memory of the embodiment, after the sacrificial pillars 300 and the remaining supplementary layer 301 are removed, the formed structure is shown in FIG. 11a, and the side walls of the supplementary layer 301 have steps. According to the manufacturing method of a memory of the embodiment, after S7 and before S8, S9 is added, in which the side walls of the insulating pillars 400 are etched to enable the side walls of the insulating pillars 400 exposed in the contact holes 401 to be vertical or inclined planes. The structure formed in this operation is shown in FIG. 11b. The formed side walls of the insulating pillars 400 are vertical or inclined planes. The side walls of insulating pillars 400 are vertical or inclined planes, that is, the hole walls of the contact holes 401 are vertical or inclined planes, which help to fill the contact holes 401 with the material for forming the node contact plugs 500 later.

When the side walls of the insulating pillars 400 are etched, a dry etching process may be used. The dry etching of the insulating pillars 400 is conducive to making the side walls of the insulating pillars 400 to be inclined planes. The side walls of the insulating pillars 400 are etched by the dry etching process, and the used plasma is at least one of $SF_6$ (sulfur hexafluoride), $CF_4$ (carbon tetrafluoride), $O_2$ (oxygen) or Ar (argon).

Referring to FIG. 3a, FIG. 6a, FIG. 6b and FIG. 12, the embodiment of the disclosure further provides a memory, which includes a substrate 100, in which a plurality of active areas 102 are provided in the substrate 100, each active area 102 may include a node contact area 101; a plurality of mutually parallel bit line isolation walls 200 are arranged on the substrate 100, a plurality of node contact plugs 500 and insulating pillars 400 for isolating two adjacent node contact plugs 500 are arranged between two adjacent bit line isolation walls 200, each node contact plug 500 is in contact with the node contact area 101, and a size of an end, away from the substrate, of the node contact plug 500 is larger than a size of an end, close to the substrate 100, of the node contact plugs 500.

It is to be noted that, in some embodiments, the side walls of the node contact plugs 500 in contact with the insulating pillars 400 may be step surfaces. In other embodiments, the side walls of the node contact plugs 500 in contact with the insulating pillars 400 may be planes, and the side walls of the node contact plugs 500 in contact with the insulating pillars 400 may be vertical or inclined planes. In the direction from the top of the node contact plugs 500 to the bottom thereof, the side walls of the node contact plugs 500 in contact with the insulating pillars 400 are inclined away from the insulating pillars 400.

According to the memory in the embodiment, each active area 102 may also include a bit line contact area 103, on which a bit line contact plug 202 is arranged. Bit lines 203 are arranged on the bit line contact plug 202, and the bit line contact plug 202 and the bit line 203 are located inside the bit line isolation walls 200. The bit line contact plugs 202 are configured to electrically connect the bit line contact areas 103 with the bit lines 203, the bit line isolation walls 200 are configured to insulate the bit line contact plugs 202 and the bit lines 203, that is, the bit line isolation walls 200 can insulate the node contact plugs 500 and the bit line contact plugs 202, and can insulate the node contact plugs 500 and the bit lines 203.

According to the memory provided in the embodiment of the disclosure, the plurality of node contact plugs 500 and the insulating pillars 400 isolating two adjacent node contact plugs 500 are arranged between two adjacent bit line isolation walls 200 on the substrate 100. Each node contact plug 500 is in contact with a node contact area 101. The size of ends, away from the substrate 100, of the node contact plugs 500 is greater than the size of ends, close to the substrate 100, of the node contact plugs 500. When the node contact plugs 500 of this shape are manufactured, the openings of the contact holes 401 defined by two adjacent insulating pillars 400 and two adjacent bit line isolation walls 200 are equal to or greater than the bottom size thereof. When the node contact plugs 500 are formed in the contact holes 401, the material forming the node contact plugs 500 is easier to enter the contact holes 401. The structures of the obtained node contact plugs 500 are complete. The node contact plugs 500 can effectively in contact with the node contact areas 101 on the substrate 100, thereby improving the performance of the memory. Moreover, the side walls of the node contact plugs 500 in contact with the insulating pillars 400 may be planes because the side walls of the insulating pillars 400 are inclined planes during the manufacturing procedure of the memory. The inclined walls may be planes, which can further make it easier for the material for forming the node contact plugs 500 to enter the contact holes 401 when forming the node contact plugs 500. The structures of the obtained node contact plugs 500 are complete, and the node contact plugs 500 are in effective contact with the node contact areas 101 on the substrate 100, so as to improve the performance of the memory.

Various examples or embodiments in the specification are described in a progressive way, each of the embodiments focuses on the differences from other embodiments, and same and similar parts among various embodiments may be referred to each other.

In descriptions of the specification, description of referring terms such as "one embodiment", "some embodiments", "an exemplary embodiment", "an example", "a specific example", or "some examples" refers to specific features, structures, materials or features described in combination with the embodiments or example involved in at least one embodiment or example of the disclosure. In the specification, exemplary description on the above terms not always refers to the same embodiment or example. Moreover, the described specific features, structures, materials or characteristics may be combined in any one or more embodiments or examples in a proper manner.

Finally, it is to be noted that the above embodiments are only used to illustrate, but not to limit, the technical solutions of the disclosure. Although the disclosure has been described in detail with reference to the foregoing embodiments, those skilled in the art should understand that the technical solutions described in the foregoing embodiments may be modified, or some or all technical features of the technical solution may be replaced with equivalent(s), but the modifications and replacements do not make the essence of the corresponding technical solutions depart from the scope of the technical solutions of each embodiments of the disclosure.

The invention claimed is:

1. A manufacturing method of a memory, comprising:
   providing a substrate, a plurality of bit line isolation walls being parallel arranged on the substrate;
   forming a plurality of sacrificial pillars arranged at intervals between each two adjacent ones of the bit line isolation walls;
   forming a supplementary layer on surfaces of the sacrificial pillars, the supplementary layer at least covering facing side surfaces of the sacrificial pillars;
   performing ion implantation to the supplementary layer, an ion concentration of the supplementary layer decreasing from a top to a bottom of the supplementary layer;
   etching the supplementary layer, a thickness of a remaining supplementary layer decreasing from a top to a bottom of the remaining supplementary layer;
   forming a plurality of insulating pillars, each between each two adjacent ones of the sacrificial pillars, side surfaces of the insulating pillars being in contact with the bit line isolation walls and the remaining supplementary layer;
   removing the sacrificial pillars and the remaining supplementary layer, the insulating pillars and the bit line isolation walls jointly define a plurality of contact holes; and
   forming a plurality of node contact plugs in the contact holes.

2. The manufacturing method of a memory according to claim 1, wherein performing ion implantation to the supplementary layer comprises:
   forming a photoresist layer covering a top and side surfaces of the supplementary layer;
   performing a back etching implantation process at least once, each back etching implantation process comprising: etching back part of the photoresist layer in a direction from the top to the bottom of the supplementary layer to expose the top and part of the side surfaces of the supplementary layer, and performing ion implantation to the exposed supplementary layer in the direction from the top to the bottom of the supplementary layer, wherein a height of the photoresist layer located on the side surfaces of the supplementary layer before each back etching is greater than the height of the photoresist layer located on the side surfaces of the supplementary layer after the back etching; and
   removing the remaining photoresist layer.

3. The manufacturing method of a memory according to claim 1, wherein performing the back etching implantation process at least once comprises performing the back etching implantation process twice, in which after the first-time of back etching of the photoresist layer, a height of the retained photoresist layer located on the side surfaces of the supplementary layer is ⅔ of a height of the sacrificial pillars;
   after the second-time of the back etching of the photoresist layer, the height of the retained photoresist layer located on the side surfaces of the supplementary layer is ⅓ of the height of the sacrificial pillars.

4. The manufacturing method of a memory according to claim 2, wherein when the ion implantation is performed to the exposed supplementary layer in the direction from the top to the bottom of the supplementary layer, ions of phosphorus or boron are adopted.

5. The manufacturing method of a memory according to claim 2, wherein the remaining photoresist layer is removed by etching with oxygen plasma.

6. The manufacturing method of a memory according to claim 1, wherein when the supplementary layer is etched, an etching solution adopted is one of a $NH_4OH$ solution and a KOH solution.

7. The manufacturing method of a memory according to claim 1, further comprising: after removing the sacrificial pillars and the remaining supplementary layer and before forming the node contact plugs in the contact holes,
   etching side walls of the insulating pillars, so as to enable the side walls of the insulating pillars exposed in the contact holes to be vertical or inclined planes.

8. The manufacturing method of a memory according to claim 7, wherein a dry etching process is adopted when the side walls of the insulating pillars are etched.

9. The manufacturing method of a memory according to claim 8, wherein when the side walls of the insulating pillar are etched by adopting the dry etching method, a plasma adopted is one of $SF_6$, $CF_4$, $O_2$ and Ar.

10. The manufacturing method of a memory according to claim 1, wherein forming the plurality of sacrificial pillars arranged at intervals between each two adjacent ones of the bit line isolation walls comprises:
    forming a sacrificial layer covering the bit line isolation walls and filling gaps between the bit line isolation walls;
    forming a mask layer on the sacrificial layer, the mask layer comprising a plurality of bar patterns parallel to each other, and projections of the bar patterns and projections of the bit line isolation walls on the substrate intersecting;

etching the sacrificial layer located in the gaps between the bit line isolation walls by utilizing the mask layer having the bar pattern to form holes between the bit line isolation walls, bottoms of the holes exposing the substrate;

removing the mask layer; and removing the sacrificial layer on top surfaces of the bit line isolation walls, and retaining the sacrificial layer in the gaps between the bit line isolation walls, so as to form the sacrificial pillars.

11. The manufacturing method of a memory according to claim 10, wherein forming the sacrificial layer covering the bit line isolation walls and filling the gaps between the bit line isolation walls comprises:

providing a silicon oxide material in the gaps between the bit line isolation walls and on surfaces, away from the substrate, of the bit line isolation walls by adopting a spin-on coating process;

curing the silicon oxide material; and polishing the cured silicon oxide material to form the sacrificial layer.

12. The manufacturing method of a memory according to claim 10, wherein forming the supplementary layer on the surfaces of the sacrificial pillars comprises:

depositing a polysilicon material on the surfaces of the sacrificial pillars, in the holes and on surfaces of the bit line isolation walls by adopting a low-pressure chemical vapor deposition process to form the supplementary layer.

13. The manufacturing method of a memory according to claim 12, wherein when the polysilicon material is deposited by adopting the low-pressure chemical vapor deposition method, a reaction temperature is between 380° C. and 500° C., a reaction pressure is between 1 Torr and 3 Torr, and a reaction gas is one of $H_3SiN(C_3H_7)_2$, $Si_2H_6$ and $SiH[N(CH_3)_2]_3$.

14. The manufacturing method of a memory according to claim 12, wherein a thickness D of the supplementary layer is ¼ L-⅓ L, wherein L is a minimum distance between bottom side walls of two adjacent ones of the sacrificial pillars in the gaps between the bit line isolation walls.

15. The manufacturing method of a memory according to claim 10, wherein forming the insulating pillars, each between each two adjacent ones of the sacrificial pillars comprises:

forming a silicon nitride layer in the gaps between the bit line isolation walls and between each two adjacent ones of the sacrificial pillars, the silicon nitride layer covering surfaces of the bit line isolation walls and a surface of the supplementary layer on the sacrificial pillars and filling the holes; and removing part of the silicon nitride layer by etching, and retaining the silicon nitride layer in the holes, so as to form the insulating pillars.

16. The manufacturing method of a memory according to claim 15, wherein the silicon nitride layer is formed between each two adjacent ones of the sacrificial pillars and in the gaps between the bit line isolation walls by one of a low-pressure chemical vapor deposition process and an atomic deposition process.

17. The manufacturing method of a memory according to claim 16, wherein when the silicon nitride layer is formed between each two adjacent ones of the sacrificial pillars and in the gaps between the bit line isolation walls by adopting the low-pressure chemical vapor deposition process, a used reaction gas is one of $SiH_4$ and $SiH_2Cl_2$; or, when the silicon nitride layer is formed in the gaps between the bit line isolation walls and between each two adjacent ones of the sacrificial pillars by adopting the atomic deposition process, a used reaction gas is one of $NH_3$ and a mixture of $N_2$ and $H_2$.

* * * * *